United States Patent
Wu et al.

(10) Patent No.: US 10,696,793 B2
(45) Date of Patent: Jun. 30, 2020

(54) PROCESS FOR PREPARING POLYIMIDES

(71) Applicant: ETERNAL MATERIALS CO., LTD., Kaohsiung (TW)

(72) Inventors: Chung-Jen Wu, Kaohsiung (TW); Meng-Yen Chou, Kaohsiung (TW); Chang-Hong Ho, Kaohsiung (TW); Shun-Jen Ghiang, Kaohsiung (TW); Po-Yu Huang, Kaohsiung (TW); Chung-Kai Cheng, Kaohsiung (TW)

(73) Assignee: ETERNAL MATERIALS CO., LTD., Kaohsiung (TW)

( * ) Notice: Subject to any disclaimer, the term of this patent is extended or adjusted under 35 U.S.C. 154(b) by 0 days.

(21) Appl. No.: 16/541,434

(22) Filed: Aug. 15, 2019

(65) Prior Publication Data
US 2020/0055986 A1    Feb. 20, 2020

(30) Foreign Application Priority Data

Aug. 16, 2018    (TW) .............................. 107128686 A

(51) Int. Cl.
*C08F 2/46* (2006.01)
*C08F 2/50* (2006.01)
*C08G 61/04* (2006.01)
*C08G 73/10* (2006.01)

(52) U.S. Cl.
CPC ................................ *C08G 73/1025* (2013.01)

(58) Field of Classification Search
CPC ............... C08F 2/46; C08F 2/50; C08G 61/04
USPC ................................... 522/176, 173, 1; 520/1
See application file for complete search history.

(56) References Cited

U.S. PATENT DOCUMENTS

| 2013/0178597 A1* | 7/2013 | Takasawa .......... C08G 73/1082 528/346 |
| 2016/0313641 A1* | 10/2016 | De ........................ G03F 7/0387 |
| 2019/0232333 A1 | 8/2019 | Narita et al. |

FOREIGN PATENT DOCUMENTS

| CN | 101560304 B | 12/2011 |
| TW | 201807033 A | 3/2018 |

OTHER PUBLICATIONS

IBM, NN890432 Summary, 1989 (Year: 1989).*
Office Action with Search Report in Taiwan Application 108127239 dated Apr. 9, 2020.
TW 201807033 A—Espacenet English Translation.
CN 101560304 B—Espacenet English Translation.

* cited by examiner

*Primary Examiner* — Jessica Whiteley
(74) *Attorney, Agent, or Firm* — Ladas & Parry LLP

(57) ABSTRACT

The present invention provides a process for preparing polyimides. The process includes cyclizing a polyimide precursor composition in a vacuum-like environment by using infrared radiation to give polyimide. The process can effectively reduce the cyclization temperature and time, thereby reducing energy and process costs.

10 Claims, 1 Drawing Sheet

PROCESS FOR PREPARING POLYIMIDES

BACKGROUND

1. Field of the Invention

The present invention relates to a process for preparing polyimide, and more particularly to a process for efficiently preparing polyimide at a low temperature (not higher than 250° C.), which includes heating a polyimide precursor composition by infrared radiation in a vacuum-like environment such that the polyimide precursor composition can be rapidly cyclized into polyimide at a temperature of not higher than 250° C. without the use of chemical imidization or the addition of an amine basic compound.

2. Description of the Related Art

Polyimide (PI) has always been the first choice for high performance polymer materials due to its excellent thermal stability and good mechanical, electrical and chemical properties. In addition, in practice, the requirements for the properties of semiconductor materials are increasingly strict, and the application limits and shortcomings of conventional inorganic materials have directed considerable attention towards polyimides, given their ability to make up for the shortcomings of conventional inorganic materials, with resulting development of a variety of multifunctional polyimides.

Polyimide is widely used in the semiconductor industry for passivation films, stress buffer films, a particle shielding films, dry etching masks, micro-electromechanical systems, interlayer insulating films and the like; other new applications are continually being developed. Polyimide materials are often used as a protective coating for integrated circuit devices since polyimide can pass the reliability test for integrated circuit devices. In addition, polyimide plays a key role in electronic packaging, enameled wires, printed circuit boards, sensing elements, separation membranes and structural materials.

Typically, polyimide is synthesized by two-stage polymerization condensation. In the first stage, a diamine monomer is dissolved in a polar, aprotic solvent such as N-methylpyrrolidone (NMP), dimethylacetamide (DMAC), dimethylformamide (DMF) or dimethyl sulfoxide (DMSO), and then an equimolar dianhydride monomer is added, followed by condensation at a low temperature or a normal temperature, to form a polyimide precursor such as polyamic acid (PAA). In the second stage, the polyimide precursor is dehydrated and cyclized into polyimide by thermal imidization. The two-stage reaction process can be briefly described as follows:

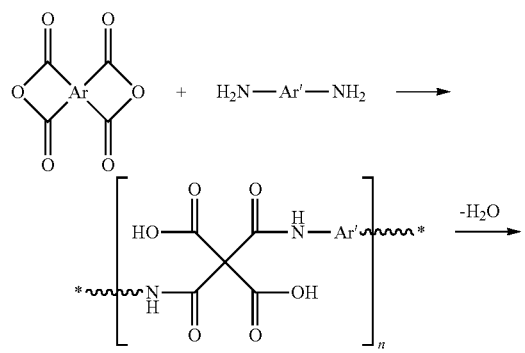

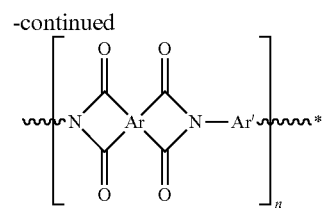

Thermal imidization promotes the dehydration and cyclization of the polyimide precursor by direct heating. Since no additional catalyst or dehydrating agent is required, the reaction is easier to control and the generation of impurities can be reduced. However, in general, the thermal imidization has high cyclization temperature (depending on the type of the polyimide precursor, for example, between 280° C. and 400°) and long cyclization time, which is not only time-consuming but also prone to work safety problems. In addition, a reaction carried out at high temperature for a long time affects the color and transparency of the polyimide and also consumes more energy. Therefore, it has been desired in the art to reduce the temperature and shorten the reaction time of thermal imidization.

One common method for reducing thermal imidization temperature is to adopt chemical imidization. Chemical imidization adds a catalyst and a dehydrating agent (acetic anhydride) to a polyimide precursor, which can rapidly dehydrate and cyclize the polyimide precursor into polyimide The catalyst may be a tertiary amine (tert-amine), such as triethylamine, pyridine, imidazole or the like. The chemical imidization has the advantage that the reaction can be carried out at a low temperature (for example, <250° C.). However, the reaction is not easy to control, and a resulting polyimide film is prone to impurities such as a catalyst, thereby affecting the physical properties of the polyimide film.

Further, another method for reducing the thermal imidization temperature adds an amine basic compound to promote an imidization reaction. However, the amine basic compound may promote the imidization reaction at room temperature. Mitsuru Ueda et al. disclosed a series of alcylamine thermal base generators (TBG) in *Chemistry Letters,* Vol. 34, p. 1372-1373 (2005), JP 2007056196 A and *Journal of Photopolymer Science and Technology,* Vol. 21, No. 1, p. 125-130 (2008). However, although such an alkylamine compound can reduce the temperature at which the imidization reaction occurs, the thermal and mechanical properties of the resulting polyimide are deteriorated due to the addition of the thermal base generator. Furthermore, since a polar solvent generally presents in the polyimide precursor composition, in order to completely remove the solvent, the operating temperature is still required to be 250° C. or above, so that low temperature cyclization remains difficult to achieve.

In view of this, the present invention is a research and development result that solves the aforementioned problems. The inventors of the present invention have found an improved process for preparing polyimide which can efficiently dehydrate and cyclize a polyimide precursor into polyimide at a low temperature, thereby saving energy and process costs. In addition, the side chain contained in the polyimide precursor can remain stable and not decompose since no high cyclization temperature is used, so that the resulting polyimide has excellent thermal properties, mechanical properties and tensile properties, and meets the needs of the industry.

SUMMARY

The present invention is directed to an improved process for preparing polyimide, which includes cyclizing a polyimide precursor into polyimide by a low temperature imidization method.

Specifically, the low temperature imidization method utilizes infrared radiation to heat a polyimide precursor composition in a vacuum-like environment to cyclize (i.e., imidize) the polyimide precursor into polyimide.

Specifically, the low temperature imidization method is earned out at a reaction temperature of not higher than 250° C.

Specifically, the vacuum-like environment means that the pressure is in a range of 0.5 to 200 mmHg.

The process of the present invention effectively reduces the cyclization temperature and shortens the cyclization time, thereby reducing energy and process costs.

According to an embodiment of the present invention, the process of the present invention constitutes an imidization reaction at a temperature lower than 250° C. without using an alkylamine thermal base generator, thereby avoiding deteriorating thermal, mechanical, and tensile properties of the polyimide due to the use of the alkylamine thermal base generator.

DETAILED DESCRIPTION

Figure 1:
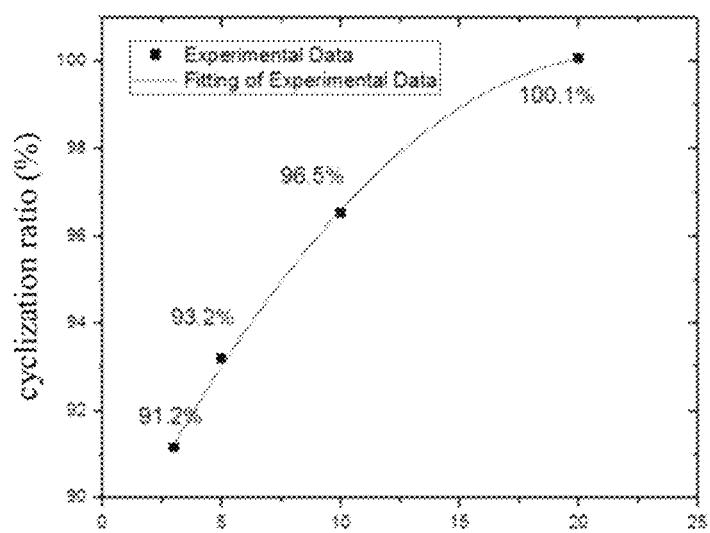
FIG. 1 shows the cyclization ratio of the polyimide precursor composition obtained in Preparation Example 1 after being heated by infrared radiation in an infrared oven at 175° C. for 3 minutes, 5 minutes, 10 minutes, and 20 minutes in a vacuum-like environment.

In order to facilitate an understanding of the disclosure set forth herein, several terms are defined below.

In the present invention, the term "about" means an acceptable error of a particular value as measured by those skilled in the art, partially depending on how the value is measured or determined.

In the present invention, the term "alkyl" means a saturated hydrocarbon group, and examples thereof include, but are not limited to, methyl, ethyl, n-propyl, isopropyl, n-butyl, isobutyl, tert-butyl, amyl, hexyl and the like.

In the present invention, the term "aryl" means a 6-carbon monocyclic, 10-carbon bicyclic- or 14-carbon tricyclic aromatic ring system, and examples thereof include, but are not limited to, phenyl, tolyl, naphthyl, fluorenyl, anthryl, phenanthryl and the like In the present invention, the term "haloalkyl" means an alkyl group substituted by halogen, wherein "halogen" means fluorine, chlorine, bromine or iodine, preferably fluorine and chlorine.

In the present invention, the term "alkoxy" means an alkyl group attached to an oxygen atom, and examples thereof include, but are not limited to, methoxy, ethoxy, propoxy, isopropoxy, n-butoxy, isobutoxy, pentyloxy, hexyloxy, benzyloxy, fluorenylmethoxy and the like.

In the present invention, the term "nitrogen-containing heterocyclic group" means a 3- to 14-membered heterocyclic group in which at least one ring carbon atom is replaced by a nitrogen atom, preferably a 4- to 10-membered nitrogen-containing heterocyclic group, more preferably a 5- or 6-membered nitrogen-containing heterocyclic group. Examples thereof include, but are not limited to, pyrrolyl, imidazolyl, pyrazolyl, pyrimidinyl, thiazolyl, pyridyl, indolyl, isoindolyl, benzimidazolyl, benzothiazolyl, quinolyl, isoquinolyl and the like. Unless otherwise specified, in the present invention, the "nitrogen-containing heterocyclic group" may be substituted or unsubstituted. Substituents are, for example, but not limited to, halogen, hydroxyl, oxo, alkyl, hydroxyalkyl, —$NO_2$ and the like.

Polyimide Precursor Composition

1. Polyimide Precursor

The polyimide precursor composition of the present invention includes a polyimide precursor, and the polyimide precursor is not particularly limited and can be those easily selected by a person of ordinary skill in the art, for example, can be those disclosed in Taiwan Patent Application Nos. 095138481, 095141664, 096128743, 097151913, 104140909, 105139585, 105139586 or 106101060. The above documents are incorporated herein by reference in their entirety. Preferably, the polyimide precursor may be photosensitive or non-photosensitive, selected from the group consisting of compounds of formula (1) to formula (7):

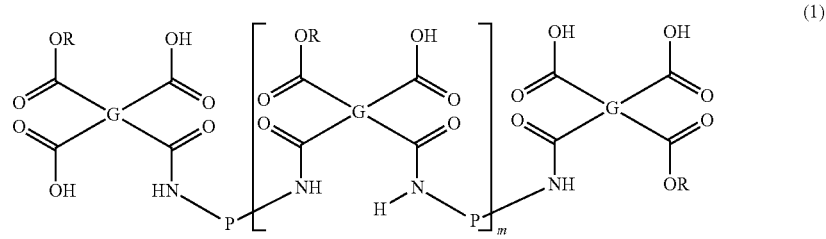

-continued
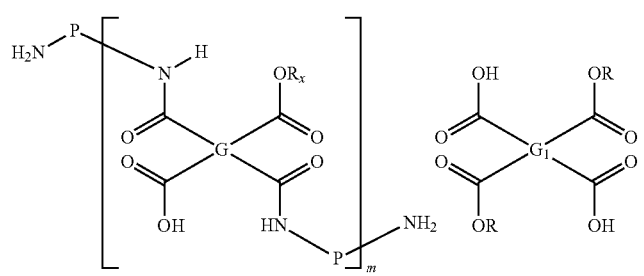
(2)
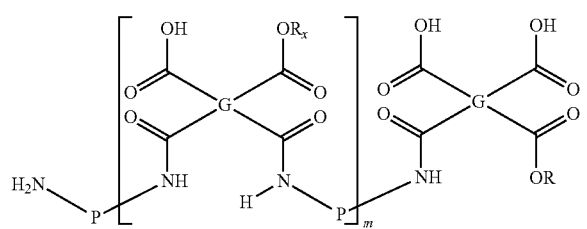
(3)
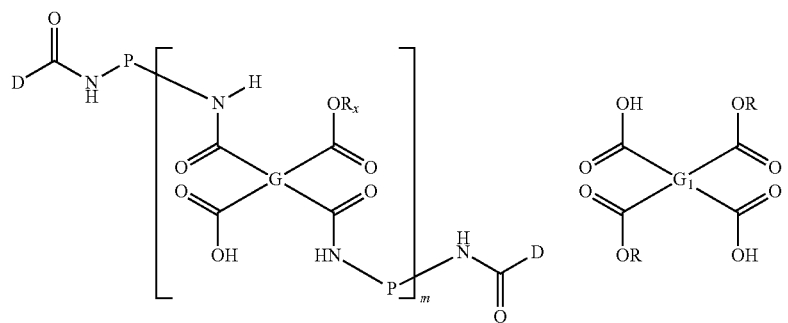
(4)
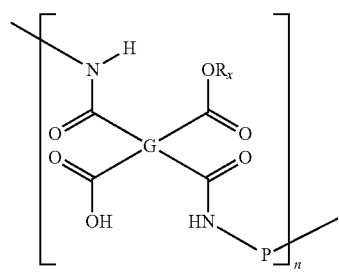
(5)
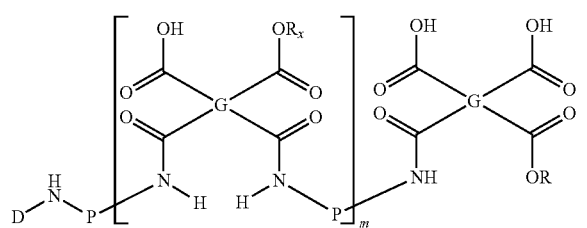
(6)
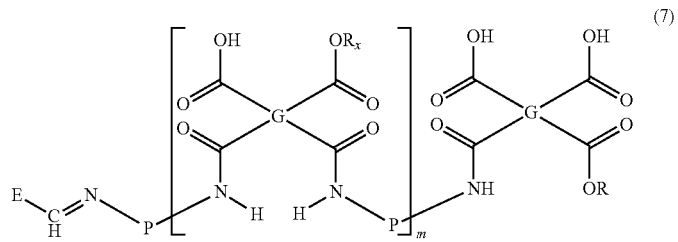
(7)

where,

G and $G_1$ are the same or different and are each independently a tetravalent organic group;

P is each independently a divalent organic group;

R is each independently a linear or branched $C_1$-$C_{14}$ alkyl group, a $C_6$-$C_{14}$ aryl group being unsubstituted or substituted with one or more groups selected from a hydroxyl group and a $C_1$-$C_4$ alkyl group, a $C_6$-$C_{14}$ aralkyl group, a phenolic group or a group having an ethylenically unsaturated group;

$R_x$ is each independently hydrogen, a $C_1$-$C_8$ alkyl group or a group having an ethylenically unsaturated group;

D is each independently a $C_1$-$C_8$ alkyl group being unsubstituted or substituted with one or more groups selected from a $C_6$-$C_{14}$ group and a nitrogen-containing heterocyclic group, a $C_1$-$C_8$ haloalkyl group, an oxygen-containing heterocyclic group being unsubstituted or substituted with one or more groups selected from a $C_1$-$C_8$ alkyl group, a $C_1$-$C_8$ hydroxyalkyl group, an oxo group and —$NO_2$, a nitrogen-containing heterocyclic group being unsubstituted or substituted with one or more groups selected from an oxo group, a $C_1$-$C_8$ alkyl group and —$NO_2$,

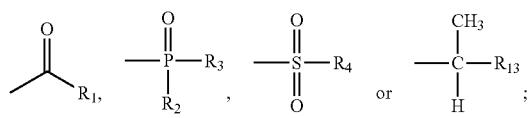

$R_1$ is hydrogen, a $C_6$-$C_{14}$ aryl group being unsubstituted or substituted with one or more groups selected from a $C_1$-$C_8$ alkyl group and a $C_1$-$C_8$ haloalkyl group, a nitrogen-containing heterocyclic group, a $C_4$-$C_{10}$ cycloalkyl group, a $C_1$-$C_8$ alkyl group or $C_1$-$C_8$ alkoxy group being unsubstituted or substituted with one or more groups selected from a $C_6$-$C_{14}$ aryl group, a nitrogen-containing heterocyclic group, —S—$R_4$,

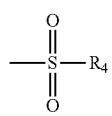

and —CN, a $C_1$-$C_8$ haloalkyl group, a $C_1$-$C_8$ haloalkoxy group or —$NR_5R_6$;

$R_{13}$ is

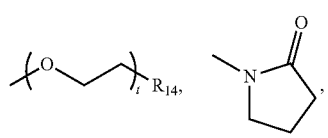

—$OR_{15}$ or a $C_1$-$C_{10}$ alkoxy group;

$R_2$, $R_3$, $R_4$, $R_5$ and $R_6$ may be the same or different and are each independently hydrogen, a $C_1$-$C_8$ alkyl group or $C_1$-$C_8$ alkoxy group being unsubstituted or substituted with one or more $C_6$-$C_{14}$ aryl groups, a $C_6$-$C_{14}$ aryl group or $C_6$-$C_{14}$ aryloxy group being unsubstituted or substituted with one or more groups selected from a $C_1$-$C_8$ alkyl group and —$NO_2$, halogen, a $C_1$-$C_8$ haloalkyl group or a nitrogen-containing heterocyclic group;

$R_{14}$ is a (meth)acryloyloxy group;

$R_{15}$ is a $C_4$-$C_{10}$ cycloalkyl group or an oxygen-containing heterocyclic group;

t is an integer from 1 to 20;

E is each independently hydrogen, a $C_1$-$C_{14}$ alkyl group, an alkylamino group, an alkylthio group, a $C_4$-$C_{10}$ cycloalkyl group, a nitrogen-containing heterocyclic group or

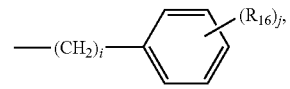

with a proviso that two Es attached to the same carbon atom with the carbon atom form a $C_6$-$C_{14}$ aryl group or heterocyclic group;

$R_{16}$ is each independently halogen, a hydroxyl group, a $C_1$-$C_8$ alkoxy group, a $C_1$-$C_8$ haloalkyl group or —$NO_2$;

i is an integer from 0 to 3;

j is an integer from 0 to 3;

m is each an integer from 0 to 100; and n is each an integer greater than 0.

According to a specific embodiment of the present invention, the above ethylenically unsaturated group is not particularly limited, and examples thereof include, but are not limited to, vinyl, propenyl, methylpropenyl, n-butenyl, isobutenyl, vinylphenyl, propenylphenyl, propenyloxymethyl, propenyloxyethyl, propenyloxypropyl, propenyloxybutyl, propenyloxyamyl, propenyloxyhexyl, methylpropenyloxymethyl, methylpropenyloxyethyl, methylpropenyloxypropyl, methylpropenyloxybutyl, methylpropenyloxyamyl, methylpropenyloxyhexyl, a group having the following formula (8) or a group having the following formula (9):

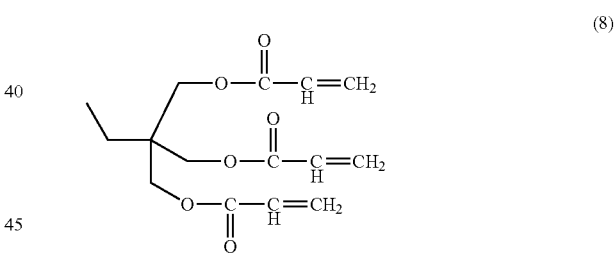

where $R_7$ is a phenylene group, a linear or branched $C_1$-$C_8$ alkylene group, a linear or branched $C_2$-$C_8$ alkenylene group a $C_3$-$C_8$ cycloalkylene group or a linear or branched $C_1$-$C_8$ hydroxy alkylene group; and $R_8$ is hydrogen or a linear or branched $C_1$-$C_4$ alkyl group. A preferred group of formula (9) is selected from the group consisting of the following groups.

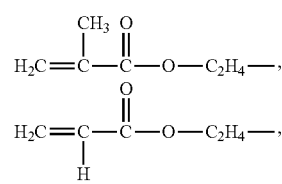

-continued

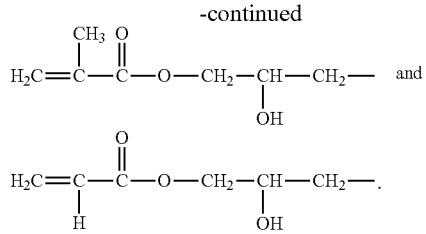
and

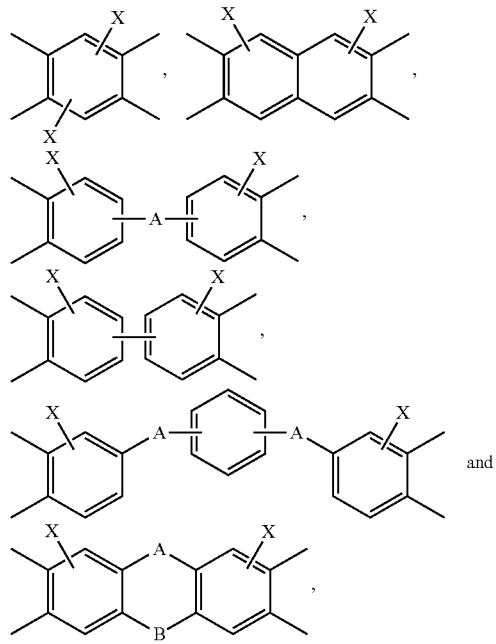

According to a specific embodiment of the present invention, the tetravalent organic groups G and $G_1$ are not particularly limited, and are, for example, but not limited to, a tetravalent aromatic group or a tetravalent aliphatic group. The above aromatic group may be monocyclic or polycyclic, and is preferably selected from the group consisting of the following groups:

where,

X is each independently hydrogen, halogen, a linear or branched $C_1$-$C_4$ perfluoroalkyl group or a linear or branched $C_1$-$C_4$ alkyl group;

A and B are each independently a covalent bond, a linear or branched $C_1$-$C_4$ alkylene group, a linear or branched $C_1$-$C_4$ perfluoroalkylene group, an alkoxylene group, a silanyl group, oxygen, sulfur, a carbonyl group, a carboxylate group, a sulfonyl group, phenylene, biphenylene or

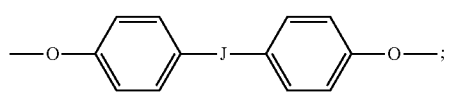

and

J is —O—, —$SO_2$—, —$CH_2$—, $C(CF_3)_2$, and $C(CH_3)_2$. More preferably, the tetravalent organic groups G and $G_1$ are each independently selected from the group consisting of the following aromatic groups:

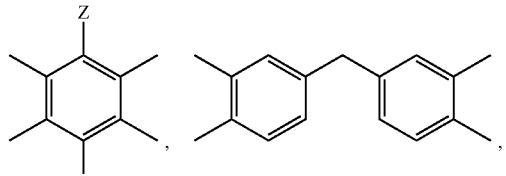

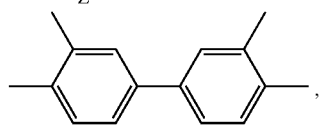

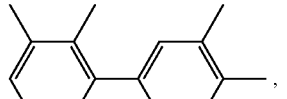

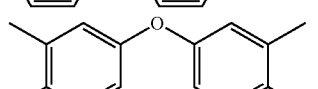

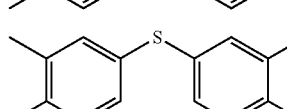

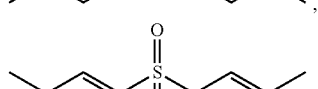

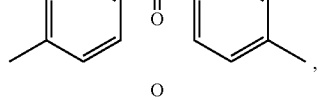

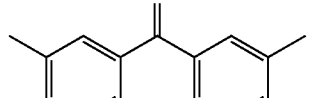

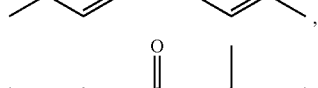

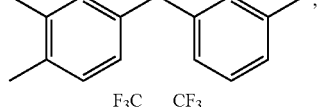

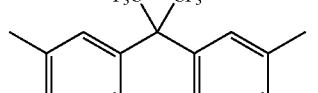

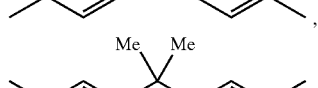

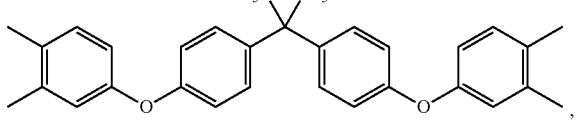

-continued

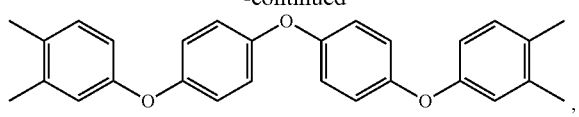

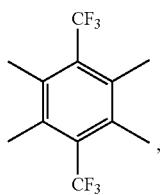

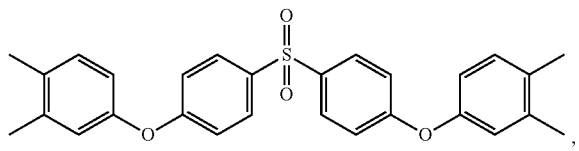

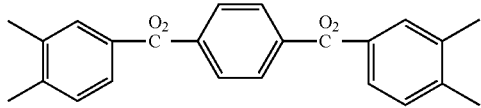

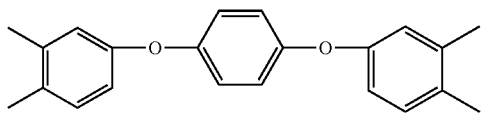

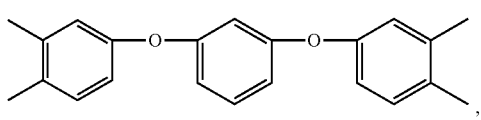

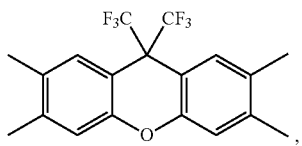

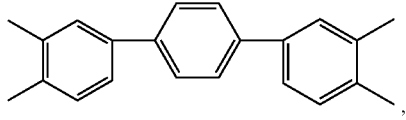

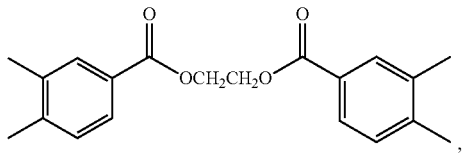

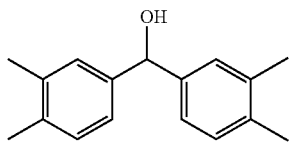

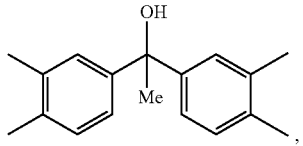

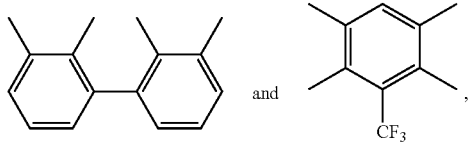

where,

Z is hydrogen or halogen. Most preferably, the tetravalent organic groups G $G_1$ are each independently

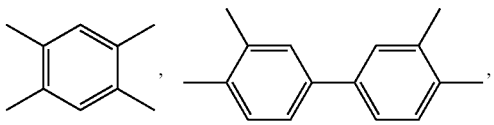

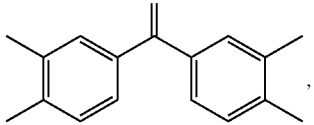

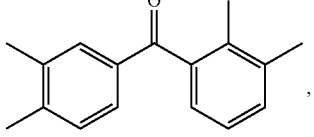

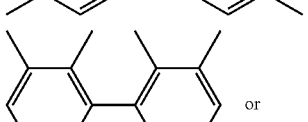 or

According to a specific embodiment of the present invention, the above tetravalent aliphatic group may be selected from the group consisting of the following groups:

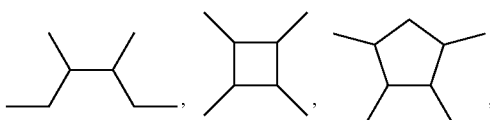

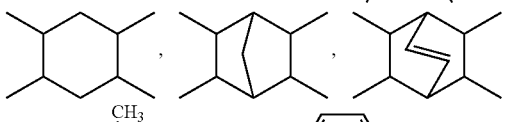

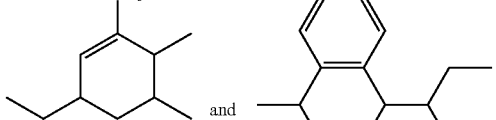

According to a specific embodiment of the present invention, the above divalent organic group P is not particularly limited, and is, for example, but not limited to, an aromatic group. Preferably, the divalent organic group P is each independently selected from the group consisting of the following groups:

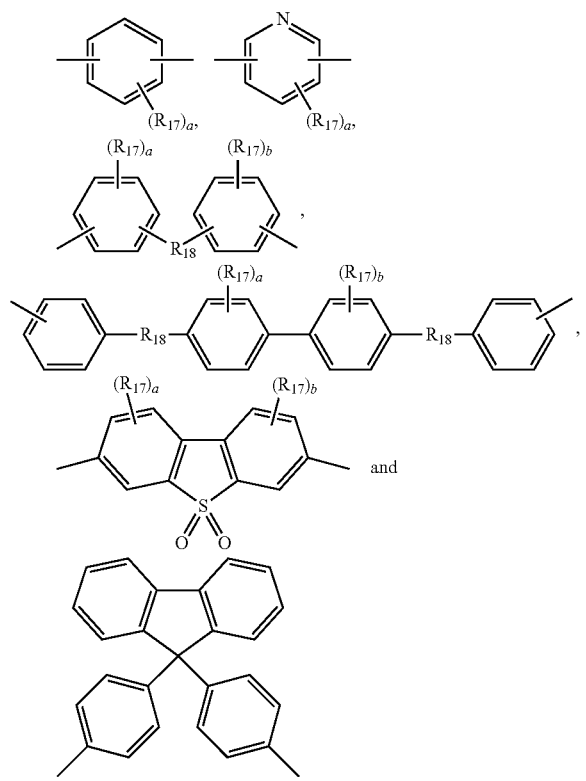

$R_{17}$ is each independently hydrogen, n $C_1$-$C_4$ alkyl group, a $C_1$-$C_4$ perfluoroalkyl group, a methoxy group, an ethoxy group, halogen, OH, COOH, $NH_2$ or SH;

a is each independently an integer front 0 to 4;

b is each independently an integer from 0 to 4; and $R_{18}$ is a covalent bond or a group selected from the group consisting of:

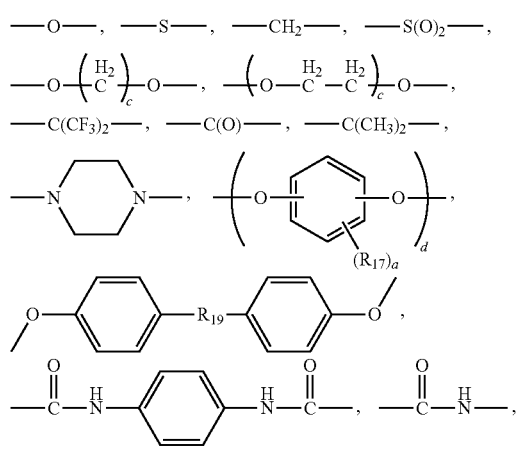

where, c and d are each independently an integer from 0 to 20;

$R_{17}$ and a are as described above; and $R_{19}$ is —$S(O)_2$—, —C(O)—, a covalent bond or a linear or branched $C_1$-$C_{18}$ alkyl group. More preferably, the divalent organic group P is each independently selected from the group consisting of the following groups:

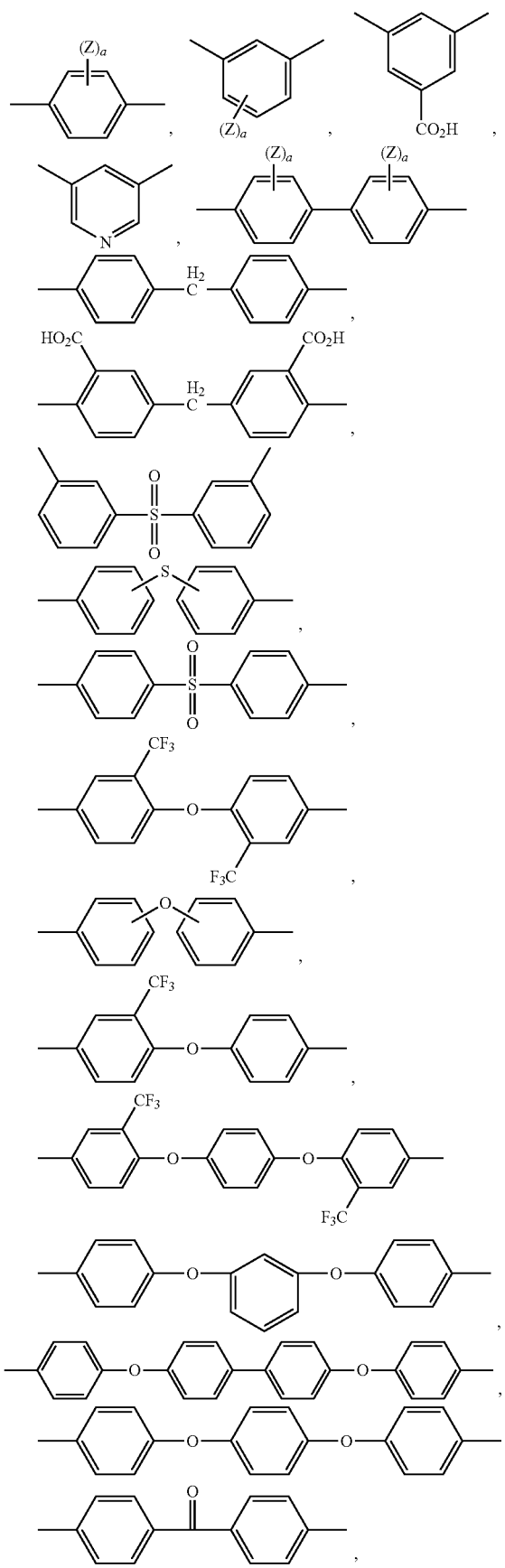

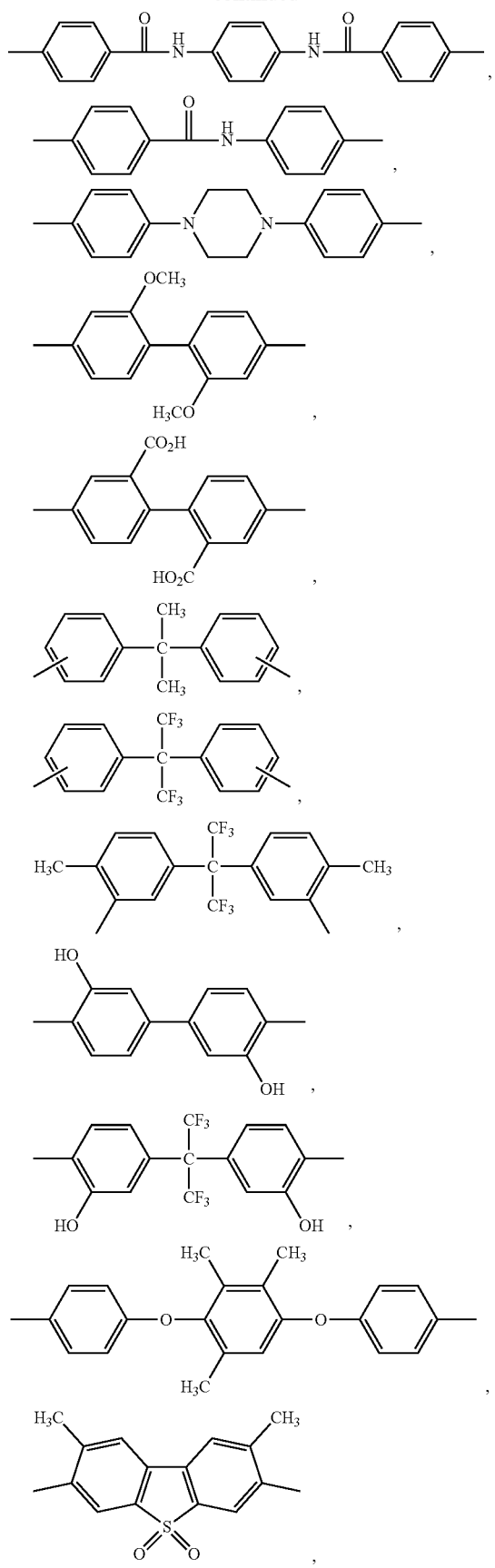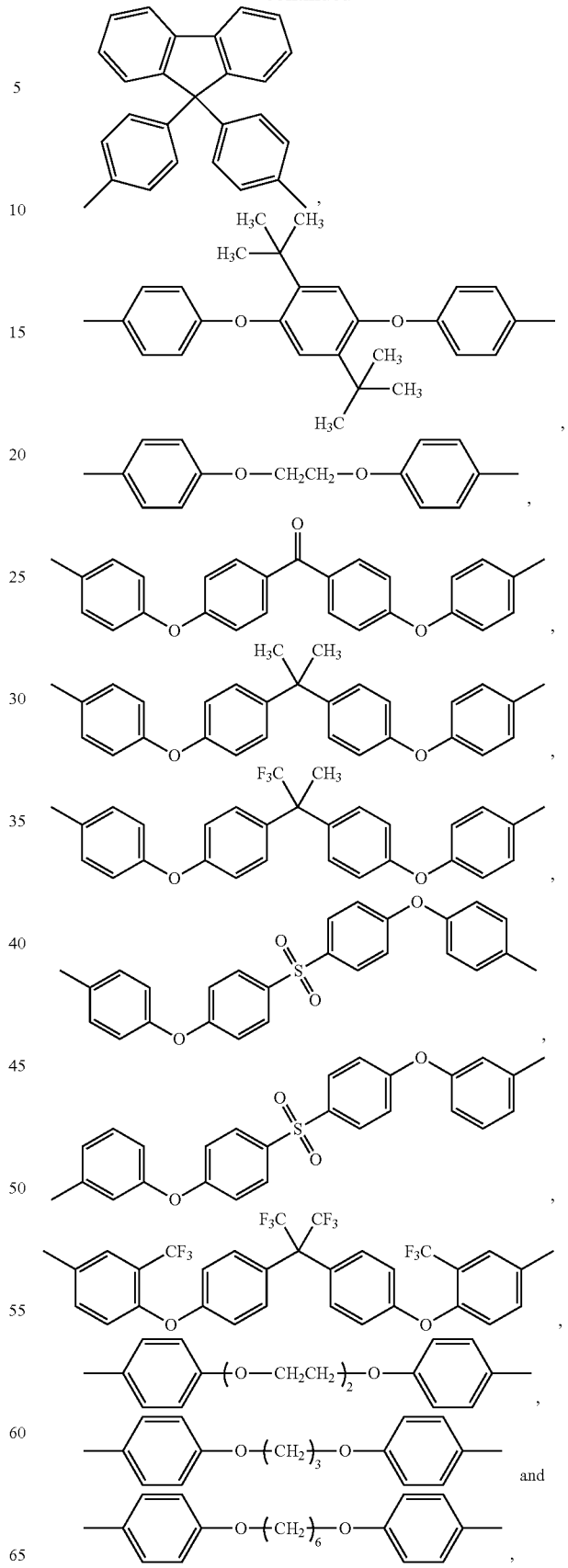

where, a is each independently an integer front 0 to 4 as described above; and

Z is each independently hydrogen, a methyl group, a trifluoromethyl group or halogen. Most preferably, the divalent organic group P is each independently

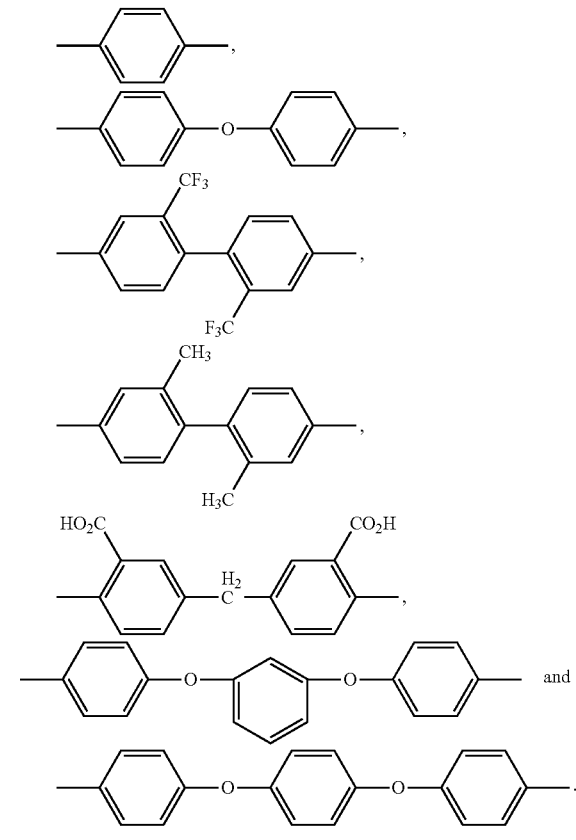

and

The above divalent organic group P may also be a non-aromatic group such as, but not limited to:

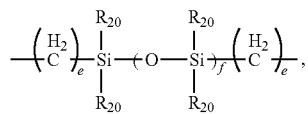

where, $R_{20}$ is each independently hydrogen, a methyl group or an ethyl group; and e and f are each independently an integer greater than 0. Preferably, the divalent organic group P is

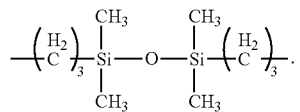

In a specific embodiment of the polyimide precursors of the above formulas (1)-(4), (6) and (7), R may each independently be a linear or branched $C_1$-$C_{14}$ alkyl group, a $C_6$-$C_{14}$ aryl group being unsubstituted or substituted with one or more groups selected from a hydroxyl group and a $C_1$-$C_4$ alkyl group, a $C_6$-$C_{14}$ aralkyl group, a phenolic group or an ethylenically unsaturated group. The linear or branched $C_1$-$C_{14}$ alkyl group is, for example but not limited to, the following groups:

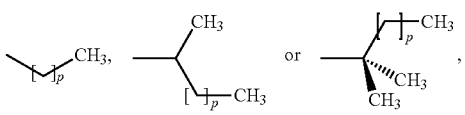

where p is an integer from 0 to 10. The above linear or branched $C_1$-$C_{14}$ alkyl group may be, for example, but not limited to: methyl, ethyl, n-propyl, isopropyl, 1-methylpropyl, 2-methylpropyl, n-butyl, isobutyl, tert-butyl, 1-methylbutyl, 2-methylbutyl, amyl, hexyl, heptyl or octyl. The above ethylenically unsaturated group is as defined above. The above $C_6$-$C_{14}$ aryl group or $C_6$-$C_{14}$ aralkyl group is preferably a group consisting of the following groups:

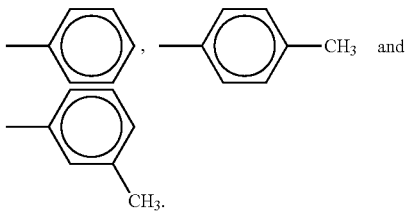

The most preferred R is selected from the group consisting of the following groups.

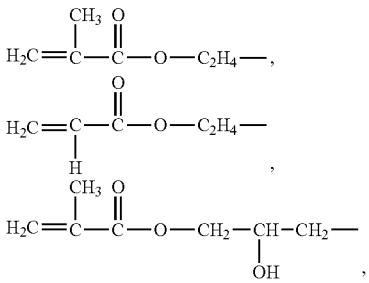

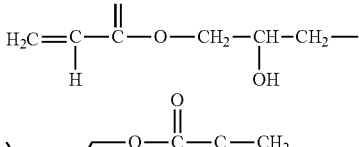

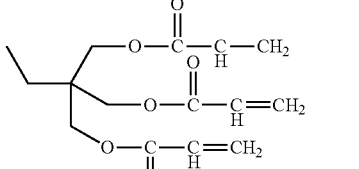

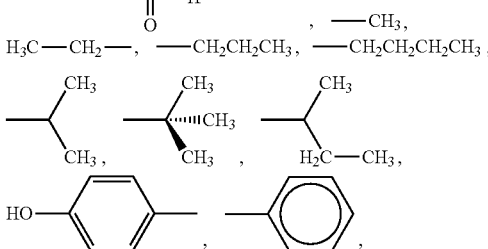

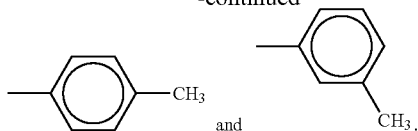 and

The group $R_x$ in the polyimide precursors of the above formulae (1) to (7) is each independently a group of hydrogen or an ethylenically unsaturated group, wherein the ethylenically unsaturated group has the definition as defined above. In the present invention, the group $R_x$ is each preferably independently hydrogen, a 2-hydroxypropyl methacrylate group, an ethyl methacrylate group, an ethyl acrylate group, propenyl, methylpropenyl, n-butenyl or isobutenyl, and more preferably, is each independently hydrogen or a 2-hydroxypropyl methacrylate group of the following formula:

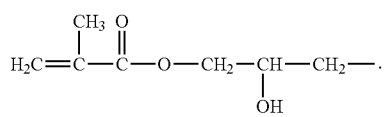

Preferably, the group D is each independently:

(i) a $C_1$-$C_8$ alkyl group being unsubstituted or substituted with one or more groups selected from a $C_6$-$C_{14}$ aryl group and a 5- or 6-membered nitrogen-containing heterocyclic group, a $C_1$-$C_8$ haloalkyl group, a 5- or 6-membered oxygen-containing heterocyclic group being unsubstituted or substituted with one or more groups selected from a $C_1$-$C_8$ alkyl group and a $C_1$-$C_8$ hydroxyalkyl group, or a 5- or 6-membered nitrogen-containing heterocyclic group substituted with one or more groups selected from a $C_1$-$C_8$ alkyl group, m oxo group and —$NO_2$;

(ii)

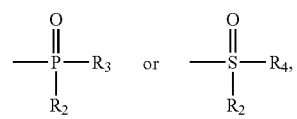

where $R_1$ is pyrrolyl, imidazolyl, pyrazolyl, pyrimidinyl, pyridyl, hydrogen, $C_1$-$C_8$ alkyl, $C_1$-$C_8$ haloalkyl, $C_6$-$C_{14}$ aryl. $C_1$-$C_8$ alkoxy, $C_1$-$C_8$ haloalkoxy, $C_6$-$C_{14}$ aryl ($C_1$-$C_8$ alkoxy), —NH($C_6$-$C_{14}$ aryl), —NH($C_1$-$C_8$ alkyl), or the following groups.

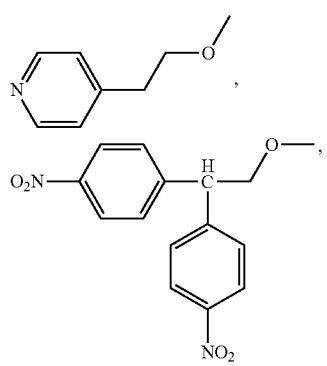

(iii)

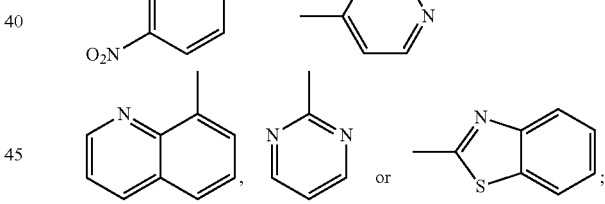

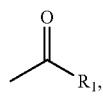 or 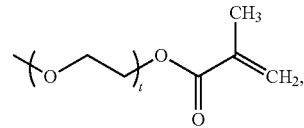

where $R_2$ and $R_3$ are each independently hydrogen, a $C_1$-$C_8$ alkyl group, a $C_6$-$C_{14}$ aryl group, a $C_1$-$C_8$ alkyl group substituted with one or more $C_6$-$C_{14}$ aryl groups or halogen; and $R_4$ is hydrogen, a $C_1$-$C_8$ alkyl group, a $C_6$-$C_{14}$ aryl group, a $C_1$-$C_8$ alkyl group substituted with one or more $C_6$-$C_{14}$ aryl groups, a $C_1$-$C_8$ haloalkyl group, or (iv)

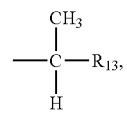

where $R_{13}$ is

-continued
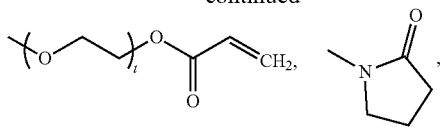
a $C_1$-$C_8$ alkoxy group
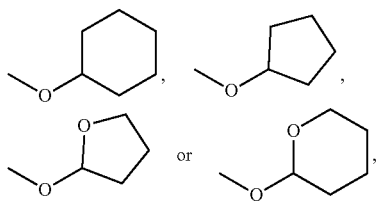
and t is preferably an integer from 1 to 5.
According to an embodiment of the present invention, D is: methyl, ethyl, propyl, butyl, or selected from the group consisting of:
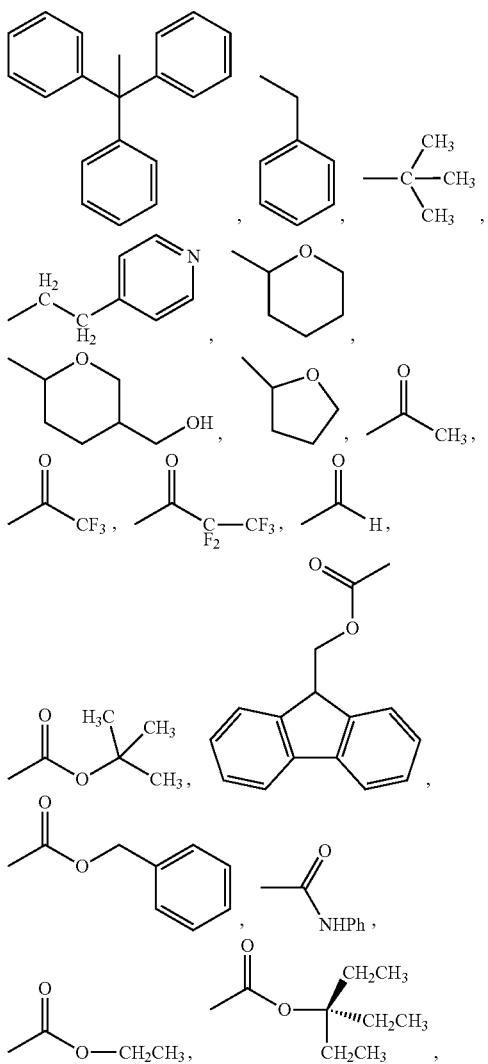
-continued
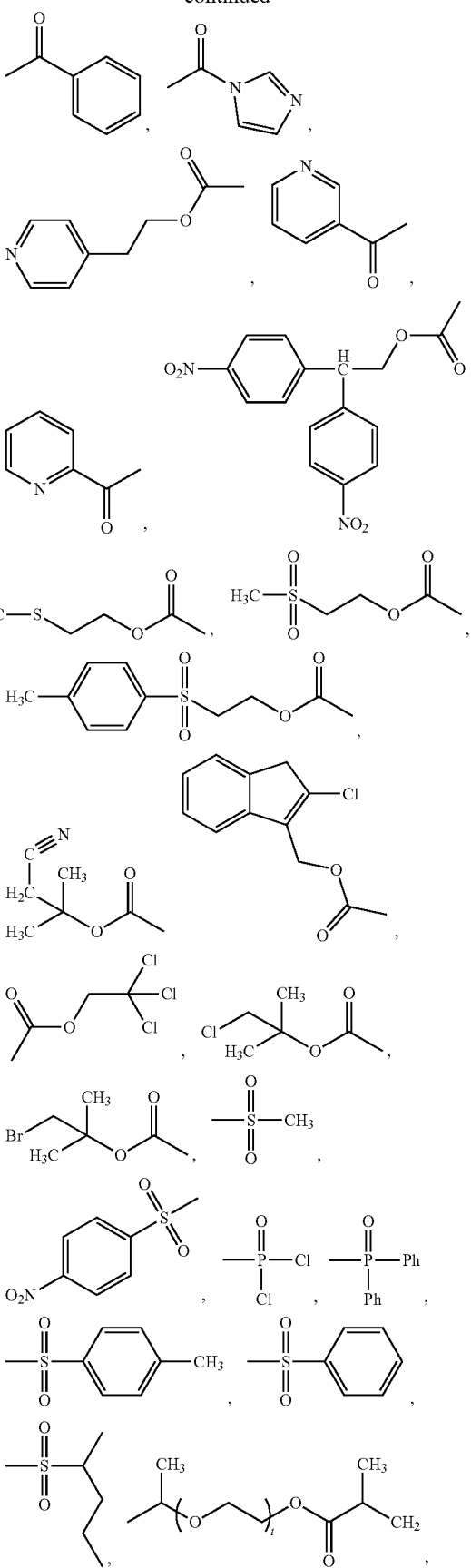

-continued

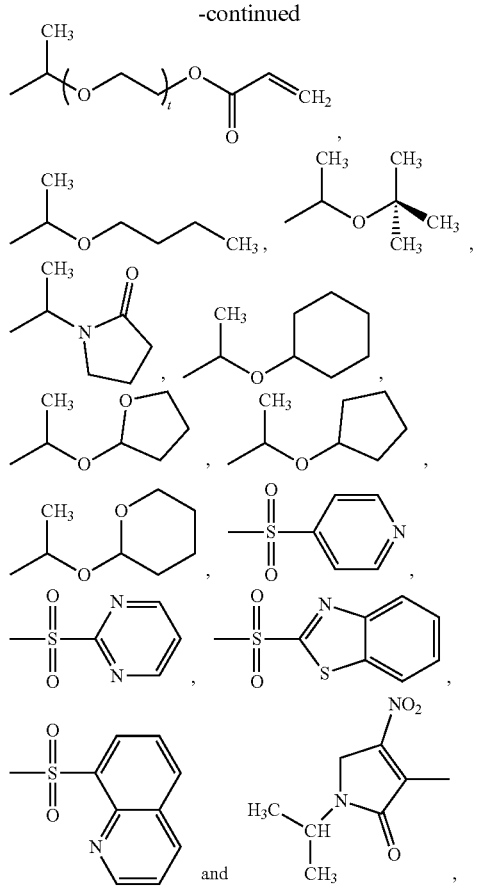

where t is preferably an integer from 1 to 5. D is preferably

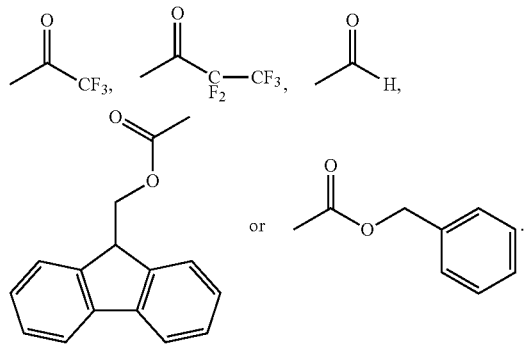

According to an embodiment of the present invention, the substituents E contained in the polyimide precursors of formula (7) may be the same or different, and each independently is hydrogen, phenyl,

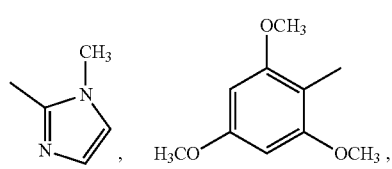

-continued

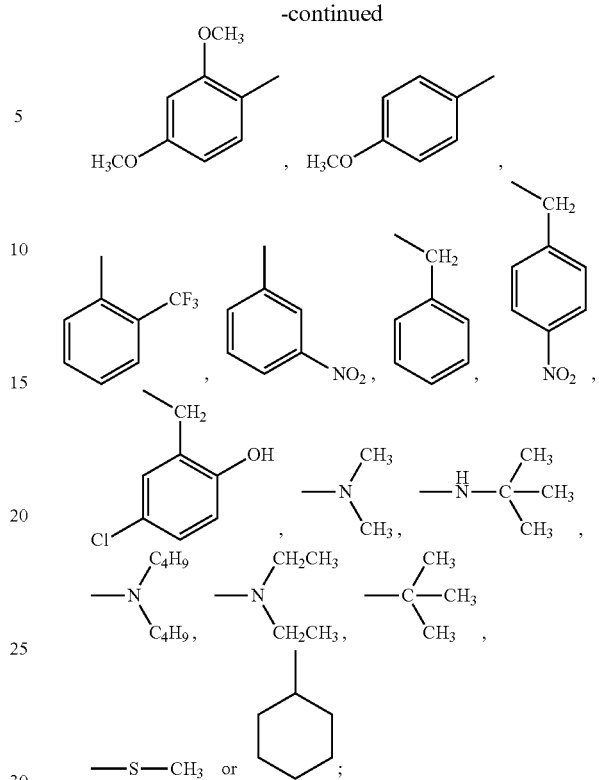

or two Es attached to the same carbon atom together with the carbon atom form a $C_6$-$C_{14}$ aryl group or a heterocyclic group such that the moiety

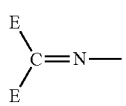

in formula (3) has the following structure:

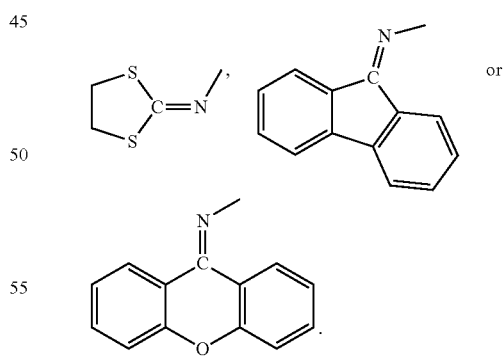

According to a specific embodiment of the present invention, m in the polyimide precursors of the above formula; (1) to (4), (6) and (7) is an integer from 0 to 100, preferably an integer from 5 to 50, and more preferably an integer from 5 to 25. According to a specific embodiment of the present invention, n in die polyimide precursor of the above formula (5) is an integer greater than 0, and preferably an integer from 1 to 1000.

Based on the total weight of the entire polyimide precursor composition, the content of the polyimide precursor is 15% to 75%, and preferably 30% to 60%.

2. Solvents and Additives

The precursor composition of the present invention further includes a solvent. During polymerization, solvent increases the flexibility of the polymeric chain and facilitates the intramolecular rotation of a polyimide precursor, such that a favorable molecular structure can be formed during the cyclization of a polyimide precursor and the reaction rate of the ring-closure reaction can be increased, thereby increasing the imidization rate. The above solvent is preferably a polar aprotic solvent. The polar aprotic solvent may be, for example (but not limited to), selected from the group consisting of N-methylpyrrolidon; (NMP), N-ethylpyrrolidone (NEP), 2-pyrrolidone (NHP), dimethylacetamide (DMAC), dimethylformamide (DMF), dimethyl sulfoxide (DMSO), toluene, xylene, propylene glycol methyl ether (PGME), propylene glycol methyl ether acetate (PGMEA), γ-butyrolactone (GBL), tetraethylene glycol dimethyl ether (TGDE), and combinations thereof. Based on the total weight of the entire polyimide precursor composition, the content of the solvent is 20% to 80%, preferably 30% to 65%.

The precursor composition of the present invention may optionally include additives known to a person of ordinary skill in the art, which, for example, but are not limited to: a leveling agent, a defoamer, a coupling agent, a stabilizer, a thermal base generator, a catalyst, a photoinitiator, and the like. The content of the above additives may also be adjusted through routine experimentation by a person of ordinary skill in the art.

The coupling agent which can be used in the present invention can be selected from the group consisting of (but not limited to): 3-aminopropyltrimethoxysilane (APrTMOS), 3-aminopropyltriethoxysilane (APiTEOS), 3-ammophenyltrimettoxysilane (APTMOS), 3-aminophenyltriethoxysilane (APTEOS), and combinations thereof.

The thermal base generator which can be used in the present invention can be selected from the group consisting of (but not limited to):

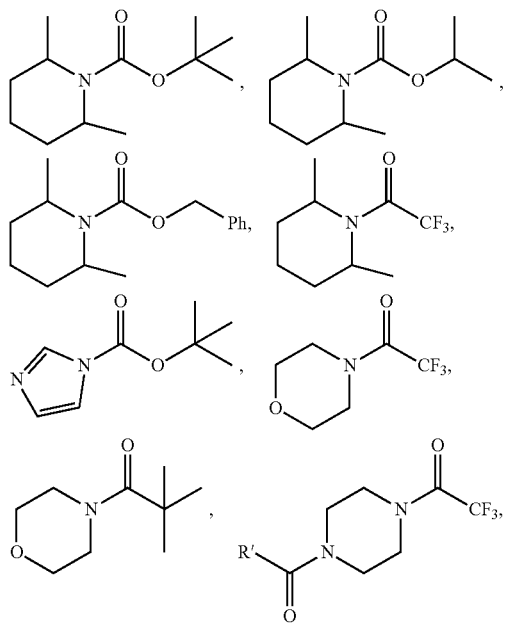

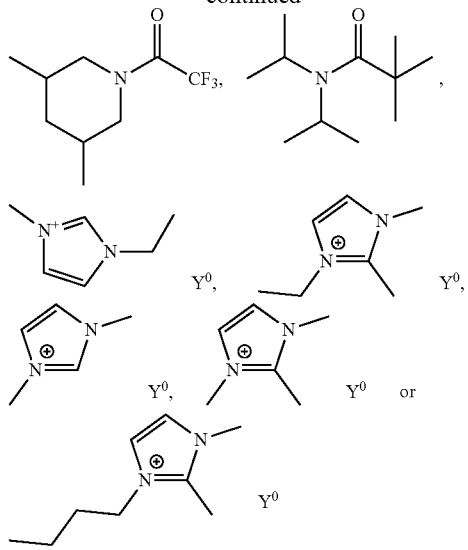

where $Y^0$ is an anionic group.

The stabilizer which can be used in the present invention can be selected from the group consisting of (but not limited to):

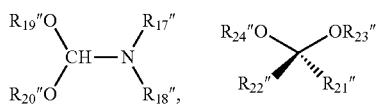

or combination thereof, where:

$R_{17}''$, $R_{18}''$, $R_{19}''$ and $R_{20}''$ are each independently a $C_1$-$C_4$ alkyl group, or $R_{19}''$ and $R_{20}''$ together with the oxygen atom to which they are attached form a 5- to 6-membered heterocyclic ring, or $R_{19}''$ and $R_{17}''$ or $R_{20}''$ and $R_{18}''$ together with the oxygen atom and the nitrogen atom to which they are attached form a 5- to 6-membered heterocyclic ring;

$R_{21}''$ and $R_{22}''$ are each independently a $C_1$-$C_4$ alkyl group, or $R_{21}''$ and $R_{22}''$ together with the carbon atom to which they are attached form a 5- to 6-membered carbocyclic ring; and $R_{21}''$ and $R_{24}''$ are each independently a $C_1$-$C_4$ alkyl group.

According to a preferred embodiment of the present invention, the stabilizer preferably includes:

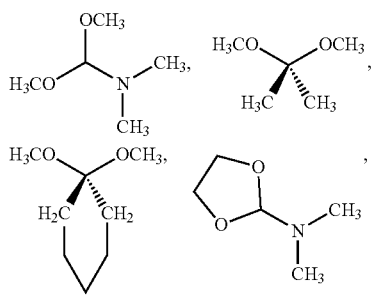

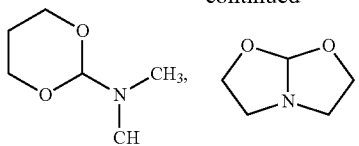

or combinations thereof. The photoinitiator suitable for use in the present invention may be selected from the group consisting of (but not limited to): benzophenone, benzoin, 2-hydroxy-2-methyl-1-propiophenone, 2,2-dimethoxy-1,2-diphenylethan-1-one, 1-hydroxy-cyclohexyl-phenyl ketone, 2,4,6-trimethylbenzoyl diphenylphosphine oxide and combinations thereof.

Improved Process for Preparing Polyimide

The present invention provides a process for preparing polyimide, in which energy is provided to a polyimide precusor composition at a low temperature to efficiently dehydrate and cyclize the polyimide precursor into polyimide, and the solvent can be removed at the low temperature, thereby saving energy and manufacturing costs.

Conventional processes for preparing polyimide comprise heating a polyamic acid to convert the polyamic acid into polyimide (i.e., by imidization or cyclization). Since oxygen and moisture may cause the molecular degradation of the polyamic acid, in order to prevent the degradation of material, it is usually necessary to introduce nitrogen throughout tire imidization process, and when the cyclization temperature is lower than 250° C., complete thermal imidization cannot be achieved. Therefore, in order to obtain a polyimide having excellent electrical properties and physical properties, the polymer is usually baked at a high temperature of 300° C. to 400° C. for a long time to obtain a completely imidized polymer. However, a high temperature process may cause problems such as damage to relevant electronic devices and generation of high thermal stress.

Different from the prior art using chemical imidization or adding an amine basic compound to lower the temperature of the imidization reaction, the inventors of the present invention have found through extensive research that, if using infrared radiation in combination with a vacuum-like environment to provide heat to a coating layer of the polyimide precursor composition, it is surprising that the imidization temperature can be lowered and the imidization can be accomplished at a low temperature (for example, not higher than 250° C.) without using high temperature as in the past.

The present invention provides an improved process for preparing polyimide, including providing heat to a polyimide precursor composition in a vacuum-like environment using infrared radiation to cyclize the polyimide precursor (i.e., to dehydrate and cyclize the polyimide precursor by thermal imidization) into polyimide. The temperature of the above imidization reaction is not higher than 250° C. By using the process according to the present invention, the polyimide exhibits excellent mechanical properties, thermal properties, and electrical properties, and can be prepared under low temperature conditions not exceeding 250° C.

In a specific embodiment of the present invention, the imidization reaction is carried out at an imidization temperature from about 100° to about 250° C. For example, the imidization temperature can be 100° C., 110° C., 120° C., 130° C., 140° C., 150° C., 160° C., 170° C., 175° C., 180° C., 185° C., 190° C., 195° C., 200° C., 205° C., 210° C., 215° C., 220° C., 225° C., 230° C., 235° C., 240° C., 245° C. or 250° C., and is preferably from about 130° C. to about 225° C.

In addition, in the existing process for preparing polyimide, heating is usually carried out by using a hot air oven with nitrogen, in order to avoid the degradation of polyamic acid during the cyclization of the polyimide precursor into polyimide. However, heating with hot nitrogen is often accompanied with a higher cyclization temperature and a longer cyclization time. For example, to have a cyclization ratio of 98% or above, the heating temperature is visually 280° C. or above, and the cyclization time is about 2-3 hours.

In the present invention, the vacuum-like environment refers to a state of reduced pressure compared with the atmosphere.

According to some embodiments of the present invention, the vacuum-like environment of the present invention refers to a pressure of no more than 200 mmHg (or torr), preferably a vacuum-like environment from about 0.5 mmHg to about 200 mmHg, for example, a vacuum-like environment of 0.5 mmHg, 0.75 mmHg, 1 mmHg, 5 mmHg, 10 mmHg, 20 mmHg, 30 mmHg, 40 mmHg, 50 mmHg, 60 mmHg, 70 mmHg. 80 mmHg, 90 mmHg. 100 mmHg, 200 mmHg. etc., and more preferably a vacuum-like environment from about 0.7 mmHg to about 100 mmHg.

The process of the present invention is carried out at the aforementioned vacuum-like pressures. If die pressure is too high (for example, higher than 200 mmHg), the number of particles that can absorb heat in the reaction environment is too large, the solvent and water generated during cyclization cannot be effectively removed, and the reaction temperature cannot be effectively lowered to 250° C. or below. If the pressure is too low (for example, less than 0.5 mmHg), the solvent in the polyimide precursor composition is lost too quickly so that the polyimide precursor cannot be effectively rotated intramolecularly to close the ring, which results in low cyclization ratio. In addition, when the solvent is lost too quickly, the intermolccular collision of the polyimide precursors is reduced, the molecular weight cannot be effectively increased by intermolccular polymerization, and the polyimide precursor is cyclized into the polyimide before a desired molecular weight is reached, so that a polyimide film having good physical properties cannot be obtained.

There are three methods of heat transfer: heat conduction, heat convection and heat radiation. Heat radiation is the main heat transfer method in the present invention. Although heat radiation is one of the three heat transfer methods, different from heat conduction and convection, heal radiation does not require the presence of any medium and can pass heat directly from one object to another. Heat radiation emits energy in the form of electromagnetic radiation, such as radiation by invisible infrared light. Heat radiation is not of a single frequency, and the frequency distribution range is quite wide. In order to save energy, the process of the present invention is carried out by using infrared light (infrared radiation) in a specific wavelength range.

The infrared emission wavelength range of the infrared radiation used in the present invention may be adjusted according to the wavelength of characteristic absorption peaks of the corresponding polyimide precursor (for example, C=O, the absorption wavelength is, such as 2.85 μm, 5.7 μm), and it is preferable to make the range of the infrared emission wavelength as close as possible to that of the characteristic absorption peaks of the polyimide precursor. When the emission wavelength of the infrared radiation is close to or the same as that of die absorption peaks of the material, the energy at the infrared emission wavelength can be sufficiently absorbed by the reactants, so that the reactants rapidly obtain the required energy to promote cyclization, thereby the time required for imidization can be shortened.

The present invention uses infrared radiation in combination with a vacuum-like environment, which can save 30% or more energy compared with the conventional hot air oven. Without being bound by theory, it may be that if the infrared light does not meet a substance that can absorb the wavelength energy thereof, the infrared light will penetrate the substance until encountering a substance that can absorb the energy, and transfer the energy to the inside of the substance. Therefore, the infrared heating device has high energy utilization rate and can efficiently provide the activation energy required for the reaction.

In a specific embodiment of the present invention, a specific wavelength range of the infrared radiation can further increase the heat absorption efficiency, and effectively save energy and process costs. The specific wavelength range refers to the infrared emission wavelength range of the infrared radiation from 1 micron to 10 microns, preferably from 2 microns to 8 microns, and more preferably from 2 microns to 6 microns.

In a specific embodiment of the present invention, an infrared emission wavelength of 5.7 μm is used. Since energy is directly transferred, energy transfer efficiency is high, and space is also saved, so the heating time is less than 40 minutes, and is preferably in the range from about 5 to about 25 minutes.

The preparation method of polyimide of the present invention includes, for example, but is not limited to.

1. Polymerization of Polyimide Precursor

Taking the polyimide precursor of the above formula (3) as an example, the polymerization process thereof includes:

(a) a dianhydride of the following formula (10) is reacted with a compound having a hydroxyl group (R—OH) to form a compound of the following formula (11): and

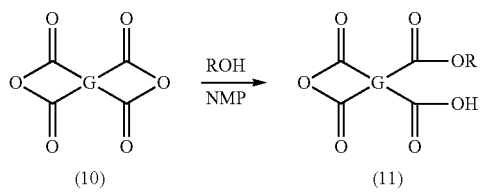

(10)    (11)

(b) a diamine compound of the formula H$_2$N—P—NH$_2$ is added to a product of step (a) to form a polyimide precursor of the formula (12).

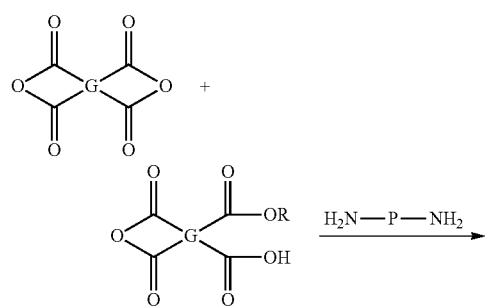

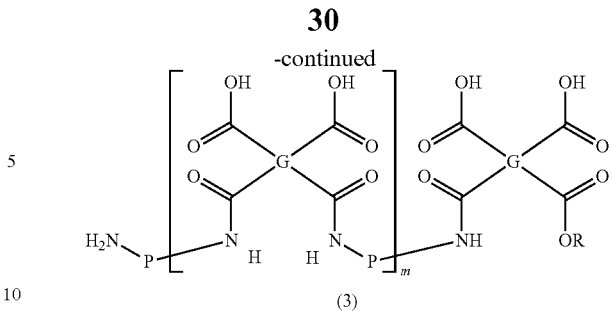

(3)

(c) a monomer having a group (R$_x$), such as a photosensitive epoxy acrylate monomer, is optionally added to perform a reaction to form a polyimide precursor of the formula (13)

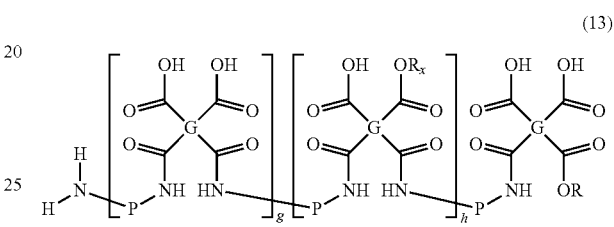

(13)

where R, G, P and R$_x$ are as previously defined herein, g, h and m are each an integer from 0 to 100, and g+h≤100.

2. Preparation of Polyimide

After the preparation of the polyimide precursor is completed, an additive and/or solvent may be added in an appropriate ratio to produce a polyimide precursor composition, and the polyimide precursor composition is uniformly stirred in a nitrogen system.

According to an embodiment of the present invention, the mixed polyimide precursor composition can be directly coated on copper foil by a doctor blade; or according to another embodiment of the present invention, the polyimide precursor composition is coated on a carrier, part of the solvent is removed by drying to form a polyimide precursor dry film, and then the dry film is pressed and transferred onto a substrate, such as a flexible circuit board, wafer, glass, display, or touch panel.

Next, the dry film is baked by using infrared radiation (for example, by using an infrared heater, infrared oven, infrared lamp or other suitable equipment) in a vacuum-like environment to cyclize and polymerize the polyimide precursor into polyimide. The present invention can achieve the objective of performing imidization at a temperature below 250° C. without using chemical imidization or adding an amine basic compound. The baking temperature can be adjusted according to the process equipment or the adopted vacuum environment, and the baking time can be adjusted according to the degree of cyclization. According to an embodiment of the present invention, the baking time is about 5 to 30 minutes, and a polyimide coating or film is obtained after the baking is completed.

Preferably, the present invention uses an infrared light source having wavelength in the same range as the infrared spectrum absorption peak of the polyimide precursor, which can further reduce the cyclization temperature and shorten the cyclization time. The process of the present invention is simple and does not need to use the reagent of the chemical imidization method, thereby avoiding problems in the chemical imidization method, such as difficulty in controlling the reaction as well as impurities. In addition, the process of the present invention can achieve imidization in a shorter time and at a lower temperature, thereby effectively saving energy and process costs.

Compared with the prior art, the process of the present invention is operated by using infrared radiation in a vacuum-like environment, can effectively lower the cyclization temperature, and can realize efficient cyclization, thereby saving the cyclization time. Therefore, the polyimide prepared by the process of the present invention is efficiently produced at a relatively low temperature, and the side chain of the corresponding polyimide precursor is not decomposed due to the high cyclization temperature. For example, even if the side chain of tire polyimide precursor has an aromatic group, since the process of the present invention is performed at a relatively low temperature, the yellowing problem of the aromatic group due to high temperature can be solved, and therefore, a transparent, colorless polyimide can be easily produced and can be used in applications requiring a transparent appearance such as a screen.

In a preferred embodiment of the present invention, the process of the present invention can achieve low-temperature imidization even without using an alkylamine compound (thermal base generator). Therefore, the disadvantage of the prior art wherein the thermal properties and mechanical properties of the polyimide deteriorate due to the use of the alkylamine compound can be avoided.

In addition, since oxygen and moisture in the air cause the molecular degradation of the polyimide precursor and thus affects the physical properties of the subsequent polyimide, it is generally necessary to introduce nitrogen throughout the imidization process. The process of the present invention is operated using by using infrared radiation in a vacuum-like environment, thereby reducing the usage amount of nitrogen or even eliminating the need for nitrogen. Therefore, process costs can be reduced.

The process of the present invention can be applied to any existing polyimide application, such as (but not limited to); integrated circuit industry; electronic packaging, enameled wires, flexible printed circuit boards, sensing elements, separation membranes, structural materials, etc. Since the process of the present invention can be performed at a lower temperature and does not require the use of the reagent of a chemical imidization method, it is particularly advantageous for high-order electronic processes such as wafer level packaging and photo imageable coverlay (PIC).

The present invention will now be described in conjunction with the following embodiments. In addition to the following embodiments, the present invention may be carried out in other ways without departing from the spirit of the present invention. The scope of the present invention should not be only construed and limited by the disclosure of the description. In addition, unless otherwise stated herein, the terms "a/an", "the" and the like used in the description, especially in the appended claims, should be understood to include both singular and plural forms. The term "about" is used for describing measured values, including acceptable errors, partially depending on how the ordinary technician performs the measurements The word "or" in the list of two or more items covers the interpretation of all of the following words: any one item in the list, all items in the list, and any combination of items in the list.

Preparation Example 1

Preparation of Polyimide Precursor Composition 21.81 g (0.10 mol) of pyromellitic dianhydride (PMDA) was dissolved in 200 g of N-methyl-2-pyrrolidone (NMP) to obtain a mixture. The mixture was heated to 50° C., reacted and stirred for two hairs. Thereafter, 1.16 g (0.01 mol) of 2-hydroxyethyl acrylate (HEA) was slowly dropwise added into the mixture, reacted and stirred at a fixed temperature of 50° C. for two hours. Finally, 20.02 g (0.1 mol) of 4,4'-oxydianiline (ODA) was added to the mixture, and after complete dissolution, reaction and stirring were performed at a fixed temperature of 50° C. for six hours to obtain a photosensitive polyimide precursor composition having a solid content of about 17 wt %.

Preparation Example 2

Preparation of Polyimide Precursor Composition 2.181 g (0.01 mol) of PMDA was dissolved in 200 g of NMP and stirred at room temperature for two hours. 1.301 g (0.01 mol) of 2-hydroxyethyl methacrylate (HEMA) was slowly dropwise added, heated to 50° C., reacted and stirred for two hours. Then, 10.8140 g (0.1 mol) of p-phenylenediamine (p-PDA) was added to the solution. After complete dissolution, 19.6308 g (0.09 mol) of PMDA was added, reacted and stirred for six hours at a temperature of 50° C. Finally, 2.1825 g (0.01 mol) of di-tert-butyl dicarbonate ($BOC_2O$) was added and stirred for one hour to obtain a photosensitive polyimide precursor composition having a solid content of about 18 wt %.

Example 1

The polyimide precursor composition of Preparation Example 1 was uniformly coated on copper foil (Nan Ya NPV copper foil, ⅓ oz (12 μm)) with a doctor blade to a thickness of about 80 μm, and baked using an infrared oven (Noritake, PLR-920) in a vacuum-like environment (0.75 mmHg) at 175° C. respectively for 3 minutes, 5 minutes, 10 minutes and 20 minutes to form a polyimide film having a thickness of about 10 μm on he copper foil.

Comparative Example 1

The polyimide precursor composition of Preparation Example 1 was uniformly coated on copper foil (Nan Ya NPV copper foil, ⅓ oz (12 μm)) with a doctor blade, and baked using an infrared oven (Noritake. PLR-920) at 1 atm nitrogen pressure respectively at 200° C., 225° C., 250° C., 275° C. and 300° C. for 20 minutes to form a polyimide film on the copper foil.

Example 2

The photosensitive polyimide precursor composition obtained in Preparation Example 2 was uniformly coated on a copper foil substrate by a spin coater. After drying in an oven at 90° C. for 4 minutes, the copper foil substrate was exposed with a UV exposure machine, and then placed in an oven to be baked at 120° C. for 10 minutes. At this time, the solid content was about 65 wt %. Tlte copper foil substrate was immersed in a 1 wt % aqueous $K_2CO_3$ solution of for partem development. Then the copper foil substrate was baked using an infrared oven (Noritake, PLR-920) in a vacuum-like environment (0.05 mmHg, 0.5 mmHg, 5 mmHg, 20 mmHg, 50 mmHg, 100 mmHg, 200 mmHg and 300 mmHg) respectively at 200° C. and 225° C. for 5, 10, 15, 20, and 30 minutes to form a polyimide film having a thickness of about 10 μm on the copper foil.

Comparative Example 2

The process was the same as that in Example 2, except that the copper foil substrate was baked at 1 atm nitrogen pressure respectively at 225° C., 250° C., 275° C. and 300° C. for 5, 10, 15, 20, 30, and 60 minutes to form a polyimide film having a thickness of about 10 μm on the copper foil.

<Test Method>

[Preparation of Polyimide Standard Film]

The polyimide precursor composition of Example 1 or Example 2 was uniformly coated on copper foil (Nan YaNPV copper foil, ⅓ oz (12 μm)) with a doctor blade, and a two-stage baking was performed using a nitrogen oven. In the first stage, the temperature was raised from room temperature to 150° C. in 35 minutes, and fixed at 150° C. for baking for 30 minutes. In the second stage, the temperature was raised from 150° C. to 400° C. within 50 minutes, and fixed at 400° C. for baking for 120 minutes to form a polyimide standard film on the copper foil. The cyclization ratio of the polyimide standard film was 100%.

[Test of Cyclization Ratio]

The cyclization ratio can be regarded as the degree of imidization of die polyimide precursor. A standard piece and a sample to be tested were tested by ATR-FTIR (Cary 630 FUR; Agilent Technologies), and the cyclization ratio of the sample to be tested was calculated. The cyclization ratio of the sample to be tested can be obtained by the following equation:

Cyclization ratio(%)=$(R_{test}/R_{standard})\times 100\%$ where:

$R_{test}$ is defined as the ratio of the integral value of the C—N bond absorbance to the integral value of the C═O bond absorbance in the infrared spectrum of die sample to be tested, which can be expressed as follows:

$R_{test}$(the integral value of die C—N bond absorption peak of the sample to be tested)/(the integral value of the C═O bond absorption peak of the sample to be tested);

$R_{standard}$ is defined as the ratio of the integral value of the C—N bond absorption peak to the integral value of the C═O bond absorption peak in die infrared spectrum of the standard piece, which can be expressed as follows:

$R_{standard}$=(the integral value of the C—N bond absorption peak of the standard piece)/(the integral value of the C═O bond absorption peak of the standard piece); and where the absorption peak of the C—N bond is at about 1360 $cm^{-1}$; and the absorption peak of the C═O bond is at about 1700 $cm^{-1}$.

FIG. 1 shows the cyclization ratio of the polyimide precursor composition in Example 1 baked at 175° C. for 3 minutes, 5 minutes, 10 minutes and 20 minutes in a vacuum-like environment. The results show that, by using the process of the present invention, the polyimide precursor composition can achieve a cyclization ratio of 100% in a heated environment of 175° C. within 20 minutes in a vacuum-like environment.

Figure 2:
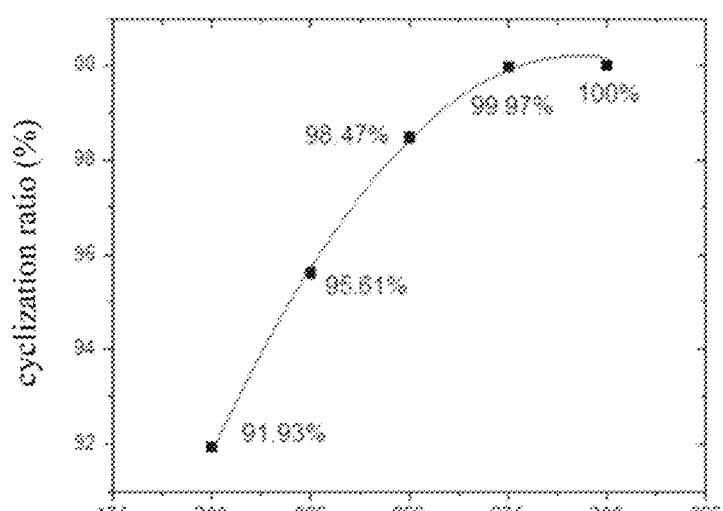
FIG. 2 shows the cyclization ratio of the polyimide precursor composition obtained in Preparation Example 1 after being heated by infrared radiation in an infrared oven at 200° C., 225° C., 250° C., 275° C., and 300° C. for 20 minutes at a normal pressure.

FIG. 2 shows the cyclization ratio of the polyimide precursor composition in Comparative Example 1 heated at 200° C., 225° C., 250° C., 275° C. and 300° C. for 20 minutes at normal pressure.

From the results of Example 1 and Comparative Example 1, it can be seen that by using the process of the present invention (infrared radiation in combination with a vacuum-like environment), the polyimide precursor composition can achieve a cyclization ratio of 100% within 20 minutes by being baked at 175° C. However, if the infrared radiation is used in combination with an environment at normal pressure, as in Comparative Example 1, it is necessary to use a temperature of 275° C. or higher to make the polyimide precursor reach a cyclization ratio of 100% within the same time. From this, it can be understood that the imidization temperature can be greatly reduced by using the process of the present invention.

Table 1 shows the cyclization ratio of the polyimide precursor composition of Example 2 after baking at 200° C. for 5, 10, 15, 20, and 30 minutes in a vacuum-like environment (0.05 mmHg, 0.5 mmHg, 5 mmHg, 20 mmHg, 50 mmHg, 100 mmHg, 200 mmHg and 300 mmHg).

Table 2 shows the cyclization ratio of the polyimide precursor composition of Example 2 after baking at 225° C. for 5, 10, 15, 20, and 30 minutes in a vacuum-like environment (0.05 mmHg, 0.5 mmHg, 5 mmHg, 20 mmHg, 50 mmHg, 100 mmHg, 200 mmHg and 300 mmHg).

From the results of Table 1 and Table 2, it can be seen that baking the polyimide precursor composition obtained in Preparation Example 2 with infrared radiation at 200° C. or 225° C. in a vacuum-like environment (pressure between 0.5 mmHg and 200 mmHg) according to the process of the present invention can achieve a cyclization ratio of 90% or above within 10 or 5 minutes at the earliest. However, if the pressure is lower than 0.5 mmHg, the solvent in the composition loses extremely quickly, so that the rotation in the polyimide precursor molecule is reduced, and the probability of collision and reaction is reduced, resulting in a decrease in the cyclization ratio. If the pressure is higher than 200 mmHg, the number of particles that can absorb specific energy of infrared light in the reaction system increases, the chance of the reactants to obtain sufficient energy is reduced, and the solvent and water generated during cyclization cannot be removed effectively, resulting in low cyclization ratio.

Table 3 shows the cyclization ratio of the polyimide precursor composition of Comparative Example 2 after baking respectively at 225° C., 250° C., 275° C. and 300° C. for 5, 10, 15, 20, 30, and 60 minutes at 1 atm nitrogen pressure.

From the results of Tables 2 and 3, baking the polyimide precursor composition obtained in Preparation Example 2 with infrared radiation at 225° C. in a vacuum-like environment (pressure between 0.5 mmHg and 200 mmHg) according to the process of the present invention can achieve a cyclization ratio of 90% or above within 5 minutes. However, if the infrared radiation is used for baking at 225° C. at normal pressure, it is necessary to bake for 60 minutes to achieve a cyclization ratio of the polyimide precursor of 90% or above. From this, it can be understood that the reaction time of imidization can be greatly shortened by using the process of the present invention.

In general, in order to obtain a polyimide having good physical and thermal properties, the cyclization ratio of the polyimide needs to be 90% or above, preferably 95% or above, more preferably 99% or above. Baking the polyimide precursor composition obtained in Preparation Example 2 with infrared radiation at 225° C. in a vacuum-like environment according to die process of the present invention can achieve a cyclization ratio of 99% or above within 20-30 minutes; however, a high temperature of 300° C. is required to achieve a cyclization ratio of 99% or above if normal pressure is used. From this, it can be seen that the use of the process of the present invention can obtain a polyimide having a cyclization ratio of 99% or above at a lower temperature, can reduce damage to neighboring electronic devices during the imidization process, and thus has wider application.

TABLE 1

| 200° C. | 0.05 mmHg | 0.5 mmHg | 5 mmHg | 20 mmHg | 50 mmHg | 100 mmHg | 200 mmHg | 300 mmHg |
|---|---|---|---|---|---|---|---|---|
| 30 min | 64.8 ± 0.5% | 92.1 ± 0.5% | 94.2 ± 0.5% | 94.3 ± 0.5% | 94.3 ± 0.5% | 95.6 ± 0.5% | 95.5 ± 0.5% | 90.3 ± 0.5% |
| 20 min | 52.7 ± 0.5% | 90.3 ± 0.5% | 92.2 ± 0.5% | 93.5 ± 0.5% | 93.0 ± 0.5% | 94.3 ± 0.5% | 93.6 ± 0.5% | 86.6 ± 0.5% |
| 15 min | 46.5 ± 0.5% | 85.6 ± 0.5% | 88.7 ± 0.5% | 91.7 ± 0.5% | 92.2 ± 0.5% | 93.7 ± 0.5% | 88.7 ± 0.5% | 82.8 ± 0.5% |
| 10 min | 39.8 ± 0.5% | 80.3 ± 0.5% | 88.1 ± 0.5% | 88.8 ± 0.5% | 90.8 ± 0.5% | 92.1 ± 0.5% | 83.9 ± 0.5% | 77.2 ± 0.5% |
| 5 min | 33.1 ± 0.5% | 74.8 ± 0.5% | 87.3 ± 0.5% | 85.9 ± 0.5% | 84.1 ± 0.5% | 87.3 ± 0.5% | 80.2 ± 0.5% | 67.2 ± 0.5% |

TABLE 2

| 225° C. | 0.05 mmHg | 0.5 mmHg | 5 mmHg | 20 mmHg | 50 mmHg | 100 mmHg | 200 mmHg | 300 mmHg |
|---|---|---|---|---|---|---|---|---|
| 30 min | 76.3 ± 0.5% | 98.8 ± 0.5% | 99.4 ± 0.5% | 99.0 ± 0.5% | 99.7 ± 0.5% | 99.5 ± 0.5% | 97.1 ± 0.5% | 92.1 ± 0.5% |
| 20 min | 67.2 ± 0.5% | 97.9 ± 0.5% | 99.3 ± 0.5% | 99.0 ± 0.5% | 97.9 ± 0.5% | 96.4 ± 0.5% | 94.1 ± 0.5% | 88.1 ± 0.5% |
| 15 min | 54.1 ± 0.5% | 93.6 ± 0.5% | 95.8 ± 0.5% | 93.7 ± 0.5% | 94.1 ± 0.5% | 93.9 ± 0.5% | 91.6 ± 0.5% | 85.2 ± 0.5% |
| 10 min | 48.3 ± 0.5% | 90.3 ± 0.5% | 91.1 ± 0.5% | 91.9 ± 0.5% | 93.6 ± 0.5% | 93.2 ± 0.5% | 88.1 ± 0.5% | 81.3 ± 0.5% |
| 5 min | 45.6 ± 0.5% | 87.4 ± 0.5% | 89.2 ± 0.5% | 89.4 ± 0.5% | 91.6 ± 0.5% | 90.3 ± 0.5% | 84.3 ± 0.5% | 70.4 ± 0.5% |

TABLE 3

| | 1 atm | | | |
|---|---|---|---|---|
| Time | 225° C. | 250° C. | 275° C. | 300° C. |
| 60 min | 90.1 ± 0.5% | 95.1 ± 0.5% | 98.9 ± 0.5% | 100.4 ± 0.5% |
| 30 min | 81.7 ± 0.5% | 89.5 ± 0.5% | 95.2 ± 0.5% | 100.1 ± 0.5% |
| 20 min | 72.9 ± 0.5% | 82.7 ± 0.5% | 91.3 ± 0.5% | 99.8 ± 0.5% |
| 15 min | 67.6 ± 0.5% | 77.2 ± 0.5% | 86.8 ± 0.5% | 95.6 ± 0.5% |
| 10 min | 56.4 ± 0.5% | 68.3 ± 0.5% | 78.1 ± 0.5% | 89.4 ± 0.5% |
| 5 min | 47.9 ± 0.5% | 59.6 ± 0.5% | 67.3 ± 0.5% | 78.9 ± 0.5% |

What is claimed is:

1. A process for preparing polyimide, comprising cyclizing polyimide precursor into polyimide by low temperature imidization, wherein the low temperature imidization utilizes infrared radiation to heat the polyimide precursor in an environment having a pressure that is reduced as compared with atmospheric pressure, the pressure in the environment being in a range of 0.5 to 200 mmHg.

2. The process according to claim 1, wherein the low temperature imidization is performed at a reaction temperature of not higher than 250° C.

3. The process according to claim 1, wherein the low temperature iniidization is performed at a reaction temperature ranging from 130° C. to 225° C.

4. The process according to claim 1, wherein the pressure is in a range of 0.7 to 100 mmHg.

5. The process according to claim 1, wherein the polyimide precursor is selected from the group consisting of compounds of formula (1) to formula (7):

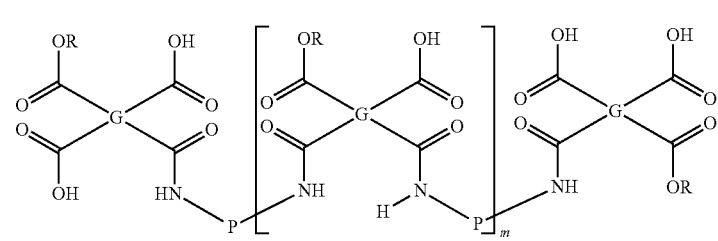

(1)

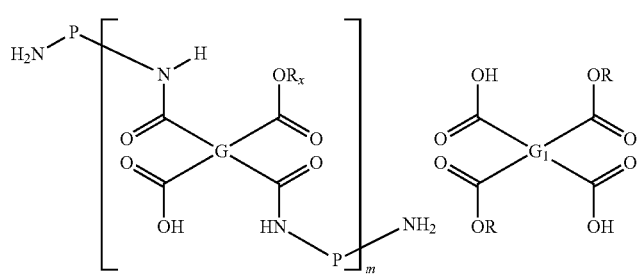

(2)

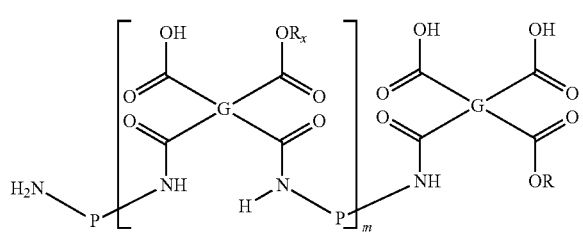
(3)

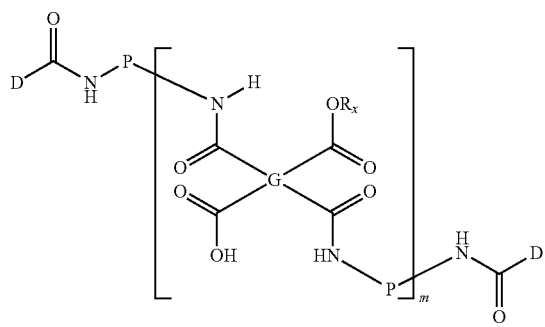
(4)

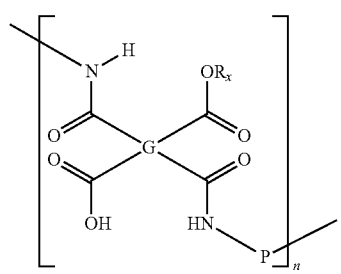
(5)

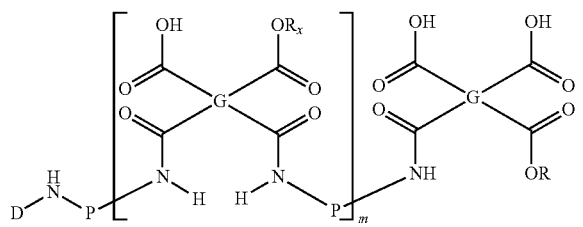
(6)

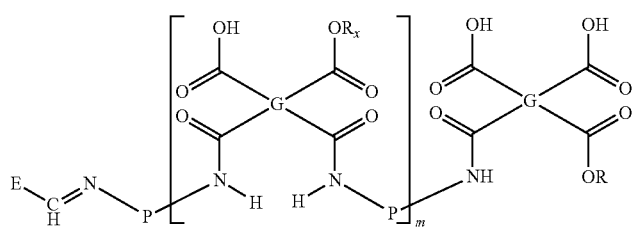
(7)

wherein,

G and $G_1$ are the same or different and are each independently a tetravalent organic group;

P is each independently a divalent organic group;

R is each independently a linear or branched $C_1$-$C_{14}$ alkyl group, a $C_6$-$C_{14}$ aryl group being unsubstituted or substituted with one or more groups selected from a hydroxyl group and a $C_1$-$C_4$ alkyl group, a $C_6$-$C_{14}$ aralkyl group, a phenolic group or a group having an ethylenically unsaturated group;

$R_x$ is each independently hydrogen, a $C_1$-$C_8$ alkyl group or a group having an ethylenically unsaturated group;

D is each independently a $C_1$-$C_8$ alkyl group being unsubstituted or substituted with one or more groups selected from a $C_6$-$C_{14}$ aryl group and a nitrogen-containing heterocyclic group, a $C_1$-$C_8$ haloalkyl group, an oxygen-containing heterocyclic group being unsubstituted or substituted with one or more groups selected from a $C_1$-$C_8$ alkyl group, a $C_1$-$C_8$ hydroxyalkyl group, an oxo group and —$NO_2$, a nitrogen-containing heterocyclic group being unsubstituted or substituted with one or more groups selected from an oxo group, a $C_1$-$C_8$ alkyl group and —$NO_2$,

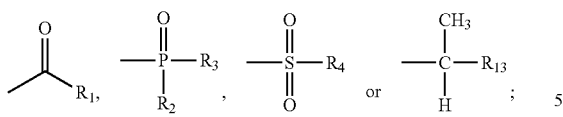

R₁ is hydrogen, a $C_6$-$C_{14}$ aryl group being unsubstituted or substituted with one or more groups selected from a $C_1$-$C_8$ alkyl group and a $C_1$-$C_8$ haloalkyl group, a nitrogen-containing heterocyclic group, a $C_4$-$C_{10}$ cycloalkyl group, a $C_1$-$C_8$ alkyl group or $C_1$-$C_8$ alkoxy group being unsubstituted or substituted with one or more groups selected from a $C_6$-$C_{14}$ aryl group, a nitrogen-containing heterocyclic group, —S—R₄,

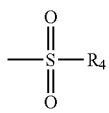

and —CN, a $C_1$-$C_8$ haloalkyl group, a $C_1$-$C_8$ haloalkoxy group or —NR₅R₆;

R₁₃ is

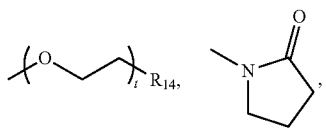

—OR₁₅ or a $C_1$-$C_{10}$ alkoxy group;

R₂, R₃, R₄, R₅ and R₆ may be the same or different and are each independently hydrogen, a $C_1$-$C_8$ alkyl group or $C_1$-$C_8$ alkoxy group being unsubstituted or substituted with one or more $C_6$-$C_{14}$ aryl groups, a $C_6$-$C_{14}$ aryl group or $C_6$-$C_{14}$ aryloxy group being unsubstituted or substituted with one or more groups selected from a $C_1$-$C_8$ alkyl group and —NO₂, halogen, a $C_1$-$C_8$ haloalkyl group or a nitrogen-containing heterocyclic group;

R₁₄ is a (meth)acryloyloxy group;

R₁₅ is a $C_4$-$C_{10}$ cycloalkyl group or an oxygen-containing heterocyclic group;

t is an integer from 1 to 20;

E is each independently hydrogen, a $C_1$-$C_{14}$ alkyl group, an alkylamino group, an alkylthio group, a $C_4$-$C_{10}$ cycloalkyl group, a nitrogen-containing heterocyclic group or

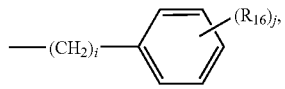

with a proviso that two Es attached to the same carbon atom are not simultaneously hydrogen; or two Es attached to the same carbon atom together with the carbon atom form a $C_6$-$C_{14}$ aryl group or heterocyclic group;

R₁₆ is each independently halogen, a hydroxyl group, a $C_1$-$C_8$ alkoxy group, a $C_1$-$C_8$ haloalkyl group or —NO₂;

i is an integer from 0 to 3;

j is an integer from 0 to 3;

m is each an integer from 0 to 100; and n is each an integer greater than 0.

6. The process according to claim 1, wherein the infrared radiation has an infrared emission wavelength ranging from 1 micron to 10 microns.

7. The process according to claim 1, wherein the infrared radiation has an infrared emission wavelength conforms to that of a characteristic absorption peak of the polyimide precursor.

8. The process according to claim 1, wherein the process comprises wafer level packaging or creation of a photo imageable coverlay.

9. The process according to claim 1, wherein the polyimide precursor has a temperature of thermal imidization that requires it to be heated with infrared radiation at atmospheric pressure at a temperature of 275° C. or higher to achieve a cyclization ratio of about 99% within 60 minutes.

10. The process according to claim 9, wherein the process consists essentially of heating the polyimide precursor with infrared radiation at a ranging from 0.5 to 100 mmHg and at the reaction temperaturer ranging from 130° C. to 225° C. to achieve a cyclization ratio of about 99% within 30 minutes.

* * * * *